US008058174B2

(12) United States Patent
Narendar et al.

(10) Patent No.: US 8,058,174 B2
(45) Date of Patent: Nov. 15, 2011

(54) METHOD FOR TREATING SEMICONDUCTOR PROCESSING COMPONENTS AND COMPONENTS FORMED THEREBY

(75) Inventors: Yeshwanth Narendar, Westford, MA (US); Richard F. Buckley, Shrewsbury, MA (US)

(73) Assignee: CoorsTek, Inc., Golden, CO (US)

( * ) Notice: Subject to any disclaimer, the term of this patent is extended or adjusted under 35 U.S.C. 154(b) by 183 days.

(21) Appl. No.: 12/335,334

(22) Filed: Dec. 15, 2008

(65) Prior Publication Data

US 2009/0159897 A1 Jun. 25, 2009

Related U.S. Application Data

(60) Provisional application No. 61/015,612, filed on Dec. 20, 2007.

(51) Int. Cl.
*H01L 21/311* (2006.01)
(52) U.S. Cl. . 438/694; 438/476; 438/703; 257/E21.224; 257/E21.054; 257/E21.603; 257/E21.605; 257/E21.699
(58) Field of Classification Search .................. 438/476, 438/694, 699, 703, 905, 906, 931; 257/E21.054, 257/E21.224, E21.226, E21.227, E21.603, 257/E21.605, E21.699; 134/1.2, 1.3
See application file for complete search history.

(56) References Cited

U.S. PATENT DOCUMENTS

| | | | |
|---|---|---|---|
| 1,900,053 A | 3/1933 | Glidden | |
| 2,233,434 A | 3/1941 | Smith | |
| 3,219,182 A | 11/1965 | Cornwell, Jr. | |
| 3,951,587 A | 4/1976 | Alliegro et al. | |
| 4,836,965 A | 6/1989 | Hayashi et al. | |
| 4,859,385 A | 8/1989 | Tanaka et al. | |
| 4,889,686 A | 12/1989 | Singh et al. | |
| 4,900,531 A | 2/1990 | Levin | |
| 4,944,904 A | 7/1990 | Singh et al. | |
| 4,978,567 A | 12/1990 | Miller | |
| 4,981,822 A | 1/1991 | Singh et al. | |
| 4,982,068 A | 1/1991 | Pollock et al. | |
| 4,998,879 A | 3/1991 | Foster et al. | |
| 5,021,367 A | 6/1991 | Singh et al. | |
| 5,043,303 A | 8/1991 | Singh et al. | |
| 5,079,039 A | 1/1992 | Heraud et al. | |
| 5,194,330 A | 3/1993 | Vandenbulcke et al. | |
| 5,238,619 A | 8/1993 | McGuigan et al. | |
| 5,494,439 A | 2/1996 | Goldstein et al. | |
| 5,494,524 A | 2/1996 | Inaba et al. | |
| 5,509,555 A | 4/1996 | Chiang et al. | |
| 5,514,439 A | 5/1996 | Sibley | |
| 5,538,230 A | 7/1996 | Sibley | |
| 5,589,116 A | 12/1996 | Kojima et al. | |
| 5,628,938 A | 5/1997 | Sangeeta et al. | |
| 5,738,908 A | 4/1998 | Rey et al. | |
| 5,752,609 A | 5/1998 | Kato et al. | |
| 5,770,324 A | 6/1998 | Holmes et al. | |
| 5,834,387 A | 11/1998 | Divakar et al. | |
| 5,846,611 A | 12/1998 | Christin | |
| 5,897,311 A | 4/1999 | Nishi | |
| 5,904,892 A | 5/1999 | Holmes | |
| 5,942,454 A | 8/1999 | Nakayama et al. | |
| 6,024,898 A | 2/2000 | Steibel et al. | |
| 6,062,853 A | 5/2000 | Shimazu et al. | |
| 6,066,572 A | 5/2000 | Lu et al. | |
| 6,093,644 A | 7/2000 | Inaba et al. | |
| 6,099,645 A | 8/2000 | Easley et al. | |
| 6,162,543 A | 12/2000 | Dubots et al. | |
| 6,277,194 B1 * | 8/2001 | Thilderkvist et al. | 117/94 |
| 6,296,716 B1 | 10/2001 | Haerle et al. | |
| 6,357,604 B1 | 3/2002 | Wingo | |
| 6,379,575 B1 | 4/2002 | Yin et al. | |
| 6,383,298 B1 | 5/2002 | Ross et al. | |
| 6,395,203 B1 | 5/2002 | Brun | |
| 6,401,941 B1 | 6/2002 | Maumus | |
| 6,403,155 B2 | 6/2002 | Dubots et al. | |
| 6,410,088 B1 | 6/2002 | Robin-Brosse et al. | |
| 6,455,160 B1 | 9/2002 | Hiraoka et al. | |
| 6,488,497 B1 * | 12/2002 | Buckley et al. | 432/258 |
| 6,536,608 B2 | 3/2003 | Buckley | |
| 6,565,667 B2 | 5/2003 | Haerle et al. | |
| 6,617,540 B2 | 9/2003 | Zehavi | |
| 6,670,294 B2 | 12/2003 | Kobayashi | |
| 6,723,437 B2 | 4/2004 | Haerle et al. | |
| 6,776,289 B1 | 8/2004 | Nyseth | |
| 6,811,040 B2 | 11/2004 | Payne et al. | |
| 6,825,123 B2 | 11/2004 | Haerle et al. | |

(Continued)

FOREIGN PATENT DOCUMENTS

CA 2466183 A1 5/2003

(Continued)

OTHER PUBLICATIONS

B. Leroy et al., "Warpage of Silicon Wafers," Journal Electrochemical Society, vol. 127, No. 4, Apr. 1980, pp. 961-970.

(Continued)

*Primary Examiner* — Julio J Maldonado
(74) *Attorney, Agent, or Firm* — David Fonda

(57) ABSTRACT

A semiconductor processing component has an outer surface portion comprised of silicon carbide, the outer surface portion having a skin impurity level and a bulk impurity level. The skin impurity level is average impurity level from 0 nm to 100 nm of depth into the outer surface portion, the bulk impurity level is measured at a depth of at least 3 microns into the outer surface portion, and the skin impurity level is not greater than 80% of the bulk impurity level.

8 Claims, 6 Drawing Sheets

U.S. PATENT DOCUMENTS

| | | | |
|---|---|---|---|
| 6,874,638 B2 | 4/2005 | Iijima et al. | |
| 6,881,262 B1 | 4/2005 | Haerle et al. | |
| 6,890,861 B1* | 5/2005 | Bosch | 438/706 |
| 7,053,411 B2 | 5/2006 | Haerle et al. | |
| 7,501,370 B2 | 3/2009 | Narendar et al. | |
| 2002/0113027 A1 | 8/2002 | Minami et al. | |
| 2002/0130061 A1 | 9/2002 | Hengst | |
| 2002/0168867 A1 | 11/2002 | Haerle et al. | |
| 2003/0198749 A1* | 10/2003 | Kumar et al. | 427/376.3 |
| 2003/0233977 A1 | 12/2003 | Narendar et al. | |
| 2004/0129203 A1 | 7/2004 | Zehavi et al. | |
| 2004/0208815 A1 | 10/2004 | Haerle et al. | |
| 2004/0235231 A1 | 11/2004 | Narendar et al. | |

FOREIGN PATENT DOCUMENTS

| | | | |
|---|---|---|---|
| CN | 1662471 A | 8/2006 | |
| DE | 19749462 C1 | 3/1999 | |
| EP | 0582444 A1 | 2/1994 | |
| EP | 0915070 B1 | 5/1999 | |
| EP | 0924750 A2 | 6/1999 | |
| EP | 1061042 A1 | 12/2000 | |
| EP | 1072570 A1 | 1/2001 | |
| EP | 1094129 A2 | 4/2001 | |
| EP | 1184355 A1 | 3/2002 | |
| EP | 1219578 A2 | 7/2002 | |
| GB | 893041 | 4/1962 | |
| GB | 1394106 | 5/1975 | |
| GB | 2130192 A | 5/1984 | |
| JP | 7328360 | 12/1995 | |
| JP | 10197837 | 7/1998 | |
| JP | 10228974 | 8/1998 | |
| JP | 10253259 | 9/1998 | |
| JP | 11209115 A | 8/1999 | |
| JP | 2000044223 | 2/2000 | |
| JP | 2002338366 A | 11/2002 | |
| WO | 00/18702 A1 | 4/2000 | |
| WO | 02/09161 A2 | 1/2002 | |
| WO | 04/000756 A1 | 12/2003 | |
| WO | 2004/093150 A2 | 10/2004 | |
| WO | 2005/068395 A2 | 7/2005 | |

OTHER PUBLICATIONS

Daihan Scientific "Daihan" Alumina Crucible, B-from, General—type, Copyright 2004, printed from http://www.daihan-sci.com/catalogs_detail.asp?itemgrnum=1499&productgrname=Crucibles&productgrn . . . , Printed on Aug. 11, 2006.

Ghandi, "VLSI Fabrication Principles, Silicon and Gallium Aresnide", 1983, John Wiley and Sons, pp. 517-520.

H. Rauh, "Atlas for Characterization of Defects in Silicon," Wacker Siltronic AG, Burghausen, Germany, pp. 1-64, 2004.

Hyper-Therm High-Temperature Composites, Inc. "Ceramic-Matrix Composites", Feb. 27, 2003, Huntington Beach, CA, USA, Copyright 2000, Printed from http://www.htcomposites.com/fiber_reinforced_ceramics_technology.htm, Printed on Aug. 11, 2006.

Machinery Handbook, 24th Edition, Industrial Press, Copyright 1992, pp. 1598-1603.

M. Schrems et al., "Simulation of Temperature Distributions During Fast Thermal Processing," Journal Electrochemical Society, Semiconductor Silicon, 1994, pp. 1050-1059.

Nilson et al., "Scaling wafer stresses and thermal processes to large wafers," Thin Solid Films 315, 1998, pp. 286-293.

R. F. Buckley et al., "Design and Analysis of a Semiconductor Wafer Processing System for 30 mm Wafers," MS Thesis—Worcester Polytechnic Institute, Dec. 29, 1999, pp. 1-62.

Shigley et al., "Mechanical Engineering Design," McGraw Hill, copyright 1989, p. 62, p. 159.

Van Zant, "Microchip Fabrication: A Practical Guide to Semiconductor Processing," McGraw Hill, Fourth Edition, 1990, chapters 3-7.

Wolf, et al., "Silicon Processing for the VLSI Era, vol. 1", Process Technology, 1986 Lattice Press, pp. 215-216.

U.S. Appl. No. 10/176,202, filed Jun. 2, 2002, Inventors: Yeshwanth Narendar et al.

U.S. Appl. No. 10/752,434, filed Jan. 6, 2004, Inventors: Yeshwanth Narendar et al.

U.S. Appl. No. 10/328,251, filed Dec. 23, 2002, Inventors: Andrew G. Haerle et al.

U.S. Appl. No. 10/414,563, filed Apr. 15, 2003, Inventors: Andrew G. Haerle et al.

U.S. Appl. No. 10/828,680, filed Apr. 21, 2004, Inventors: Andrew G. Haerle et al.

U.S. Appl. No. 10/824,329, filed Apr. 14, 2004, Inventors: Yeshwanth Narendar et al.

U.S. Appl. No. 12/567,969, filed Sep. 28, 2009, Inventors: Yeshwanth Narendar et al.

* cited by examiner

US 8,058,174 B2

METHOD FOR TREATING SEMICONDUCTOR PROCESSING COMPONENTS AND COMPONENTS FORMED THEREBY

CROSS-REFERENCE TO RELATED APPLICATION(S)

The present application claims priority from U.S. Provisional Patent Application No. 61/015,612, filed Dec. 20, 2007, entitled "Method For Treating Semiconductor Processing Components And Components Formed Thereby," naming inventors Yeshwanth Narendar and Richard F. Buckley, which application is incorporated by reference herein in its entirety.

BACKGROUND

1. Field of the Invention

The present invention is generally related to methods for treating semiconductor processing components for use in a semiconductor fabrication environment, as well as semiconductor processing components formed thereby.

2. Description of the Related Art

In the art of semiconductor processing, typically integrated circuit devices are formed through various wafer processing techniques, in which semiconductor (principally silicon) wafers are processed through various stations or tools. Processing operations include, for example, high temperature diffusion, thermal processing, ion implant, annealing, photolithography, polishing, deposition, etc. As new generation semiconductor devices are developed, demand continues to exist in the industry to achieve better purity levels during such processing operations. In addition, there continues to be a driving force to transition to larger semiconductor wafers. The desire for superior purity levels and larger wafers introduces further integration challenges for next generation processing.

Despite improvements in the industry to address next generation purity concerns as well as handling issues associated with larger-sized semiconductor wafers, a need continues to exist in the art for further improved semiconductor processing components, methods for forming such components, and methods for processing semiconductor wafers.

SUMMARY

According to one embodiment, a semiconductor processing component includes a component having an outer surface portion containing silicon carbide, the outer surface portion having a skin impurity level and a bulk impurity level. The skin impurity level is average impurity level from 0 nm (outer surface) to 100 nm of depth into the outer surface portion, the bulk impurity level is measured at a depth of not less than 3.0 microns into the outer surface portion, and the skin impurity level is not greater than 80% of the bulk impurity level.

According to another embodiment, a method of denuding a semiconductor processing component includes providing a semiconductor processing component having an outer surface portion formed by chemical vapor deposition of SiC, and removing a target portion of the outer surface portion. The outer surface portion has a skin impurity level and a bulk impurity level, wherein the skin impurity level is average impurity level from 0 nm (outer surface) to 100 nm of depth into the outer surface portion, and the bulk impurity level is measured at a depth of not less than 3.0 microns into the outer surface portion. Further, heat treating is carried out to the component to diffuse impurities from the surface of the outer surface portion, whereby the skin impurity level is not greater than 80% of the bulk impurity level.

BRIEF DESCRIPTION OF THE DRAWINGS

The present invention may be better understood, and its numerous features and advantages made apparent to those skilled in the art by referencing the accompanying drawings.

The use of the same reference symbols in different drawings indicates similar or identical items.

DESCRIPTION OF THE EMBODIMENT(S)

Figure 1:
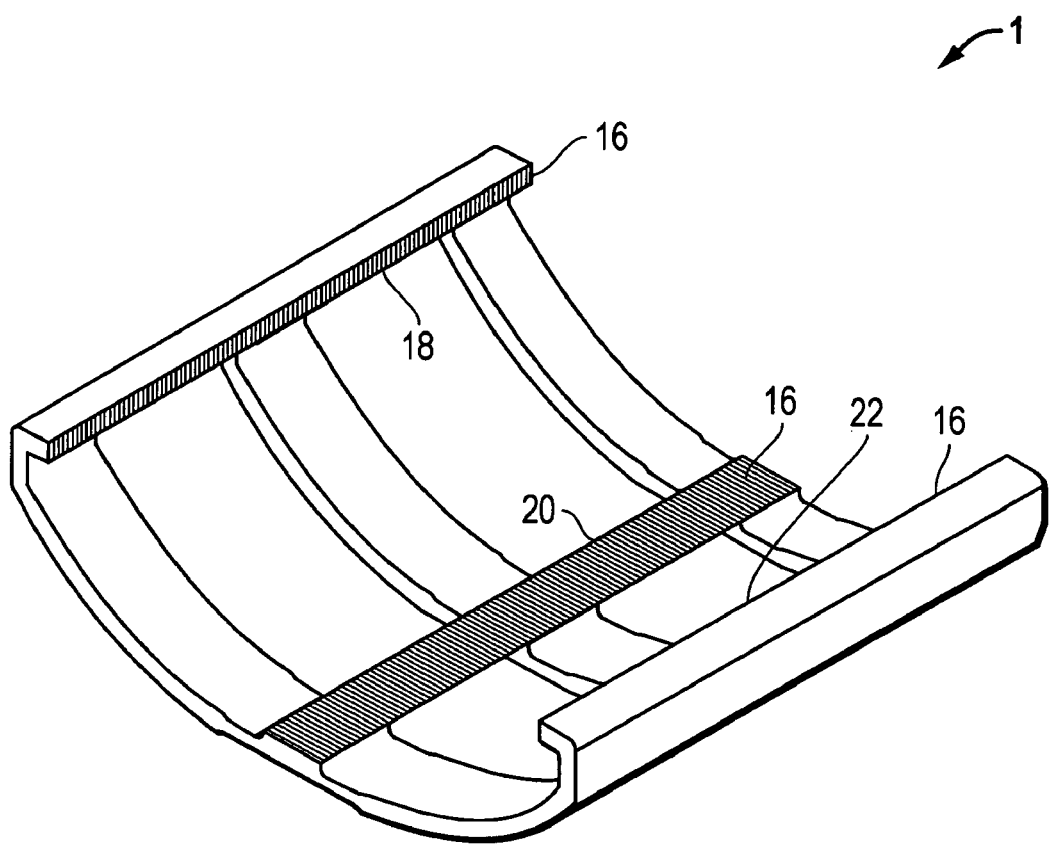
FIG. 1 illustrates an embodiment of the present invention, namely a wafer boat or carrier.

According to aspects of the present invention, a semiconductor processing component and a method for treating a semiconductor processing component are provided. The semiconductor processing component generally is formed at least partially of SiC, including an outer surface portion that has a controlled impurity content. The outer surface portion is typically formed by chemical vapor deposition (CVD), and has an skin impurity level that is not greater than 80% a bulk impurity level. The outer surface portion may be defined as an identifiable SiC layer formed by CVD, or an outer thickness of a SiC component formed principally by CVD, as in the case of free-standing CVD-SiC components, described in more detail below.

U.S. Pat. No. 6,093,644 discloses a process in which an oxidation step is carried out, followed by oxide layer removal. However, the techniques disclosed therein do not adequately address certain contamination issues, and appear to focus on global impurity levels of the component, and not impurity levels along critical portions of the component. Further, the technology appears limited to restoring pre-machined purity levels to the component in the post-machined state.

Further work in the area of high purity processing components has lead to development of process flows derived from more rigorous study of contamination sources and characterization of impurity profiles extending through an outer surface portion of components. One such process flow is described in U.S. Ser. No. 10/824,329, filed Apr. 14, 2004.

According to one aspect, the present inventors have recognized that as-deposited CVD-SiC has a spike in impurity levels at the outer surface thereof, typically within the first 0.5 µm, such as within the first 0.25 µm, or the first 0.10 µm of the outer depth of the component. While, in contrast, the impurity level through the bulk of the outer surface portion stabilizes at a relatively low level, oftentimes one, two, or even three orders of magnitude lower than an impurity level at the very outer surface of the component. The bulk impurity level is generally that impurity level which represents the constant or nominal impurity level as a function of depth, and is further described hereinbelow. Impurity levels are generally based on one of Cr, Fe, and Ni concentrations, between the outer surface and the bulk portion of the outer surface portion. According to an embodiment, the impurity levels are based on one Fe alone. In this respect, while Fe is measured according to embodiments herein, Cr and Ni concentrations can follow the same concentration trends, although at lower concentration levels.

In this context, according to an embodiment of the present invention, a semiconductor processing component having an outer surface portion formed by chemical vapor deposition of SiC is provided, and processing begins with removal of a target portion of the outer surface portion, such that a skin impurity level of the outer surface portion is not greater than about ten times the bulk impurity level of the outer surface portion. While a maximum 10× difference in impurity levels between the bulk and the surface is generally desired, further embodiments have a surface impurity level that is not greater than about five times, such as not greater than about two times the bulk impurity level. Indeed, certain embodiments have a surface impurity level that is not greater than the bulk impurity level. Processing then typically continues with further impurity reduction to form an impurity denuded zone along a skin portion of the outer surface portion, described in more detail below.

The semiconductor processing component according to embodiments herein may be chosen from one of various geometric configurations for different processing operations, and may be configured for receiving various sized wafers, whether 150 mm, 200 mm, or newer generation 300 mm wafers, for example. Particular processing components include semiconductor wafer paddles, process tubes, wafer boats, liners, pedestals, long boats, cantilever rods, wafer carriers, vertical process chambers, and even dummy wafers. Of the foregoing, several of the semiconductor processing components may be those that are configured for direct contact with and for receiving semiconductor wafers such as horizontal or vertical wafer boats, long boats, and wafer susceptors. In addition, the processing component may be configured for single wafer processing and may be used for chambers, focus rings, suspension rings, susceptors, pedestals, etc.

The semiconductor processing component may be fabricated by various techniques. For example, according to one embodiment, the processing component is formed by provision of a substrate that is generally coated with a SiC layer by CVD. The CVD-SiC layer may advantageously function to attenuate auto-doping of the underlying silicon, as well as prevent migration of impurities from the bulk of the substrate to an outer surface of the component, which may lead to contamination during semiconductor wafer processing. The substrate typically functions to provide mechanical support and structural integrity, and may be formed of various materials, such as recrystallized SiC, and by various processing pathways. In one technique, the substrate, primarily composed of SiC, is formed by slip casting or by pressing. In the case of slip casting, the slip-cast body is dried and heat treated, followed optionally by impregnation to reduce porosity. Advantageously, impregnation may be carried out by infiltration with molten silicon. Other specialized fabrication techniques may also be used, such as by utilizing a conversion process in which a carbon preform is converted into a silicon carbide core, or by subtractive process in which the core is removed following infiltration, such as by chemical vapor infiltration.

Alternatively, the semiconductor processing component may be formed of stand-alone silicon carbide, formed of one of various processes such as by CVD of silicon carbide. This particular process technique enables formation of a processing component that is of relatively high purity throughout substantially the entire bulk or interior portion of the component.

An embodiment of a wafer processing component is shown in FIG. 1. Wafer boat 1 illustrated in FIG. 1 has a plurality of grooves 16, each of which extends along the same radius of curvature. Each groove has an individual groove segment 18, 20 and 22, which are desirably machined following fabrication of the wafer boat proper. For example, the wafer boat may be fabricated according to one of the techniques described above, such as by impregnating a silicon carbide core with molten elemental silicon, then executing CVD to form a deposited silicon carbide layer. Following formation of the silicon carbide layer, machining may be carried out. In particular, the grooves may be formed and fine dimensional control may be executed by a machining operation, such as by utilizing a diamond-based machining tool. Noteworthy, while FIG. 1 illustrates a horizontal wafer boat, it is to be understood that vertical wafer boats or wafer carriers may be utilized as well, as well as other semiconductor processing components as already mentioned.

Following formation of the processing component, the processing component is subjected to a treatment process. Namely, the outer portion of the component formed of CVD-SiC is manipulated to improve purity, and particularly, the impurity of the skin portion that terminates at and defines the outer surface of the component. In one embodiment, a target portion of the outer surface portion is removed, leaving behind an outer surface that has an impurity content that is not greater than ten times that of a bulk impurity content of the outer surface portion.

Removal of the target portion may be carried out by any one of several techniques. According to one technique, the outer surface portion is removed by an oxidation-stripping process. During oxidation, the component may be exposed to a reactant species, such as a halogen gas, to further improve purity. The reactant species generally functions to complex or react with existing impurities, and volatilize during high temperature treatment. Oxidation-stripping may also reduce particle count along the outer surface, particularly beneficial in the context of semiconductor processing operations.

In more detail, oxidation of the semiconductor processing component is generally carried out to form an oxide layer by chemical reaction to form a conversion layer, as opposed to a deposited oxide layer. According to the oxidation treatment, an oxide layer consumes a target portion of the component, namely a portion of the CVD-SiC material. The oxide layer may be formed by oxidation of the component in an oxidizing environment, such as by oxidizing the component in an oxygen containing environment at an elevated temperature, such as within a range of 950 to about 1300 degrees C., and more specifically in a range of about 1000 to about 1250 degrees C. Oxidation may be carried out in a dry or wet ambient, and is typically carried out at atmospheric pressure. A wet ambient can be generated by introducing steam, and functions to increase the rate of oxidation. The oxide layer is generally silicon oxide, typically $SiO_2$. The silicon oxide layer may be in direct contact with the silicon carbide of the component, as in the case of free-standing SiC or substrates coated with silicon carbide, such as by CVD.

The oxide layer may cause residual silicon carbide particulates to be converted to silicon oxide, in addition to formation of an oxide layer along the body proper. In the case of particulate conversion, oxidation may enable later stage particulate removal. In addition, formation of an oxide coating by a conversion process, rather than a deposition process, helps trap residual impurities, such as metallic impurities, within the oxide layer, for removal along with stripping of the oxide layer.

The oxide layer may be stripped by exposure of the processing component to a solution that is capable of solubilizing (dissolving) the oxide layer. In one embodiment, the solution is an acid which contains fluorine. Typically, the pH of the solution is less than about 3.5, most typically less than about 3.0, with some embodiments being even more acidic, having a pH less than about 2.5. Alternatively, the solution may be basic, and exposed to the layer in conjunction with elevated temperatures (greater than room temp, but below $H_2O$ boiling point). Alternatively, high temperature and $H_2$ gas, such as above 1000° C., may also be used.

During oxidation, the semiconductor processing component may be exposed to a reactive species, such as a halogen gas, that forms a reaction product with contaminants present at the outer surface of the outer surface portion. Generally, both the exposure to a reactive species and oxidizing are carried out simultaneously, although alternatively the steps may be carried out separately. In this regard, use of the term simultaneously does not require that the exposure and oxidation steps to be carried out so as to be completely coextensive, but rather, the steps may overlap each other partially.

The term "halogen gas" denotes use of any halogen group elements provided in gaseous form, typically combined with a cation. Examples of common halogen gases that may be employed according to embodiments of the present invention includes HCl and $Cl_2$. Other gasses include those that contain fluorine, for example. Typically, the elevated temperature at which the semiconductor processing component is exposed to the halogen gas is sufficient to enable a reaction between the halogen gas and impurities contained along an outer surface portion of the semiconductor processing component, including along the exposed outer surface of the semiconductor processing component. For example, the elevated temperature may be within a range of about 950° C. to about 1300° C. Further, the concentration of the halogen gas may vary, and may be present in the heated environment (e.g., a furnace processing chamber) within a range of about 0.01 to about 10% of the total pressure. Typically, the lower limit of the partial pressure is somewhat higher, such as about 0.05, or about 0.10%. While the foregoing has focused halogen gases, other reactive anion-containing reactants may be utilized, provided that the reactant is chosen so as to form a reaction product with expected metallic impurities, and that the reaction product has a higher volatility than that of the metallic impurity itself.

Typically, the impurity with which the halogen gas reacts along an outer surface portion of the semiconductor processing component is a metal impurity. Metal impurities may take on the form of elemental metal, or metal alloys, and may be aluminum-based, iron-based, or chromium-based, for example. The use of a halogen gas such as HCl causes the formation of a reaction product with such metal impurities. The reaction product typically has a higher volatilization than the impurities, such that during the exposure of the processing component to the elevated temperature, the reaction product volatilizes and is thus removed from the processing component.

While the above disclosure has focused on removal of a portion of the component by reacting, notably by oxidation-stripping, other techniques for removing the target portion may be utilized. For example, the target portion may be reacted by an etching operation, by introducing an etchant species at an elevated temperature to form an etchant product that volatilizes to wholly or partly remove the target portion. For example, the etchant species may be a chlorine-containing gas, forming $SiCl_x$ etchant product that volatilizes. The Cl-containing gas may be HCl, $Cl_2$, and others. In some cases, carbon may be left behind as a by-product of the etching operation. This carbon may be removed by a high temperature burn-out treatment. It is noted that sometimes etching is referred to as graphitization, describing the carbon in the form of graphite left behind on the surface of the component. It is also generally desirable that the etchant used complexes with the impurities present along the outer surface portion, forming volatilized species such as FeCl, TiCl, etc. Further, as described above, to the extent that oxidation and oxide stripping are utilized to remove the target portion, the contaminants may be reacted to form a reaction product, such as by introducing a halogen gas as already described above in detail.

While the foregoing has focused on one cycle, processing steps such as oxidation-steps (with optional halogen gas treatment) may be repeated, and is generally repeated, several times to achieve the desired level of purity through removal of the target portion.

Prior to removal of the target portion, the component may be subjected to a machining operation, to remove, for example 10 to 100 microns of outer material of the component. While the as-deposited impurity profile is generally altered by material removal from machining operations, machining tends to nevertheless leave a spike in impurities at the outer surface of the component (i.e., the as-machined surface), as similarly observed in as-deposited CVD SiC. It has been found that the surface impurity level may extend into the outer surface portion, such as on the order of 1-3 microns, before reaching the bulk impurity level. Accordingly, in embodiments that have been subjected to machining, oftentimes the target portion to be removed has a thickness at the higher end of the above noted range of up to about 20 microns, with actual thicknesses removed on the order of 3 to 5 microns. Accordingly, to the extent that the CVD-SiC surface of the component is subjected to a mechanical abrasion or machining process such as grinding, lapping or polishing, prior to removal of the target portion, further removal would generally be effected due to elevated contamination levels present in the post-machined surface. Removal of the target portion may be executed with oxidation-strip cycles or etching cycles, for example, carried out enough times to effect high purity.

According to a variant, additional processing steps may be incorporated prior to target portion removal, with an aim to further reduce impurity levels. For example, the component may be rinsed, such as with deionized (DI) water, prior to exposure to halogen gas and subsequent processing. Agitation may be carried out during rinsing, such as with an ultrasonic mixer/agitator, to further supplement contaminant removal. Further, the rinsing solution may be acidic solution to aid in stripping the contaminants.

Alternatively, or in addition to rinsing, the component may be immersed in an acidic stripping solution prior to halogen species exposure, such as an acidic solution, to further aid in impurity removal. The rinsing and/or immersion steps may be repeated any number of times prior to further processing.

Due to the observed depth profiling as described in more detail below, typically the target portion has a thickness of at least about 0.25 microns, such as 0.38 microns, 0.50 microns, and even higher. Indeed, the target portion most generally has a thickness of at least 1.0 microns, and preferably at least about 2, such as about 2-10 microns microns, but generally less than 20 microns. Typically the CVD-SiC layer has a thickness with a range of about 10 to 1000 μm, and certain embodiments have a thickness up to about 800 μm, 600 μm, 400 μm, or up to about 200 μm. The thickness of the target portion corresponding to the depth of removal of the outer surface portion of the component is generally chosen to ensure the desired surface impurity reduction, such as driving the impurity content down from 1,000× of bulk to on the order of 10× of bulk, or even lower. Indeed, the surface impurity level is generally reduced by at least one order of magnitude if not two orders of magnitude as a result of the removal of the target portion.

Additionally, as should be clear, embodiments described above achieve a maximum impurity level from the outer surface of the component to the bulk impurity content, which is well controlled such that the spike or enriched zone is partially or even completely removed. Typically, the maximum impurity level along the initial depth of the outer surface portion extending from the outer surface to the bulk impurity content is not greater than 1.5× that of the bulk, such as not greater than 1.3× that of the bulk, and often about the same (1.0×) that of the bulk.

According to a particular embodiment, following reduction of surface impurity levels of the outer surface portion by removal of a target portion as described above, further processing is carried out to create a localized skin portion of the outer surface portion that has a further reduced impurity level. This enhanced purity level at the skin portion, which terminates at and defines the outer surface of the component, is referred to herein as a "denuded" region or zone. Denudation is typically carried out by high temperature treatment generally in the presence of a deposited or grown layer overlying the outer surface of the component. In one particular embodiment, a relatively thick sacrificial layer, typically at least 1.0 um in thickness, generally at least 5.0 um in thickness, is present. Such a sacrificial layer can be in the form of a deposited polycrystalline silicon or as deposited silicon oxide layer. Alternatively, a grown thermal silicon oxide is formed prior to elevated temperature treatment. Such use of an overlying layer functions to "getter" impurities present along a skin portion of the outer surface portion, the skin portion typically extending from the outer surface of the outer surface portion to a depth of at least 100 nm.

During heat treatment to drive impurities into the overlying layer, which may be referred to herein as a gettering layer, impurities migrate from the CVD-SiC outer surface portion into the gettering layer due to high solubility of impurities in the gettering layer at high temperatures. Those temperatures at typically not less than 1150° C., oftentimes not less than 1200° C., such as 1250° C. and higher. Heat treatment may further extend up to 1300° C. and higher as well. With respect to the above-noted solubility of impurities in the gettering layer, diffusion coefficients of Fe are of notable significance due to the relatively common Fe contamination in SiC-based semiconductor processing components. Diffusion coefficients of Fe in polycrystalline silicon are a factor of $10^9$ higher than that in CVD-SiC, making it a particular suitable material for the denudation process. Silicon oxide, including thermal grown silicon oxide, has a Fe diffusion coefficient of $10^{-12}$ $cm^2/s$, making it $10^2$ higher than Fe in CVD-SiC.

Heat treating is typically carried out in an inert atmosphere, optionally containing a halogen gas, as defined above. Particular halogen gases include HCl and $Cl_2$. Alternatively, the inert gas may be combined with $H_2$ to improve the diffusion coefficients of impurities such as Fe in the gettering layer, particularly in the case of silicon oxide.

In an alternative denudation approach, an overlying layer is grown in-situ, during heat treatment. In this particular embodiment, denudation is carried out based upon a reaction at the SiC surface with a defined amount of halide gases, which function as the metal getter for gettering the impurities such as Fe and other transition metals. The halide gases are provided at relatively low partial pressures within a generally inert atmosphere such as Ar or $N_2$. Again, the halide gases that may be present are as described above, particularly including $Cl_2$ and HCl due to the lower boiling points/higher vapor pressures of the thus formed metallic chlorides compared with metallic fluoride salts. The metal fluoride salts formed through the reaction with the gettering halide gases include salts such as $FeCl_3$, $FeCl_2$, $CrCl_3$ and $NiCl_2$.

As noted above, the foregoing denudation approach relies upon an in-situ formed layer or passivating layer, generally a silicon oxide layer. This layer is formed in-situ by a slight bleeding of oxygen-containing gas such as air into the heat treatment environment, forming a silicon oxide film on the order of 100 Å to 5000 Å in thickness, and in one embodiment, 500 to 1500 Å in thickness. Air bleeding may be carried out on the level of 1 to 50 mL/min, for example. Similarly to the denudation process described above, denudation accompanied by an air bleed to form an in-situ layer may be carried out at elevated temperatures, for example, at a temperature not less than 1150° C., not less than 1200° C., or even not less than 1250° C. in line with the above process flow. Similarly, heat treatment may be carried out for at least 4 hours, such as at least 5 hours, with typical heat treatment durations on the order of 10 to 12 hours. It is noted that the content of halides is typically minimized, generally the flow rate and attendant partial pressure of the halogen gases are set to minimize carbonization of the surface while still permitting reaction with the metal contaminants diffusing to the outer surface of the component. To further minimize graphitization, gases such as $SiCl_x$ gases may be added to the reactant gases or wholly conducted in $SiCl_x$.

The thin in-situ formed oxide layer advantageously functions to passivate the outer surface of the component during denudation treatment. In this role, the layer can help prevent unwanted reaction with the underlying SiC material, including carbonization.

Typically, denudation processing is applied to the component after removal of the target portion of the outer surface portion as discussed above. The preceeding target portion removal steps are carried out enough times to stabilize the skin impurity level to be approximately the same as that of the bulk. That is, the skin impurity level prior to denudation generally has 90 to 120% of the bulk impurity level, which is measured at a point deeper into the outer surface portion, generally at least 3 microns. By conducting a denudation process flow as described above, the skin portion may be preferentially denuded of impurities, notably reducing impurities levels to be below that of the bulk. Quantitatively, denudation is effective to reduce the impurity level to be not greater than 80% of the bulk impurity level, typically not greater than 70%, 60%, 50%, and in certain embodiments, not greater than 40% or even lower than the bulk impurity level. In certain embodiments, the skin impurity level can be at least a full order of magnitude lower than that of the bulk impurity level. Turning to specific data points, testing has demonstrated reducing the skin impurity level to 100 ppb atoms Fe, typically even lower, such as not greater than 50 ppb atoms Fe, or even not greater than 35 ppb atoms Fe. Indeed, next-generation ultra pure components have been shown to be achievable; having Fe levels less than 20 ppb, and even less than 10 ppb.

The foregoing denudation approaches exploit the nature of iron silicides and transition metal silicides in the form of impurities to melt and thereby diffuse quickly along defects such as screw locations and/or grain boundaries of the SiC-containing component. The preferential diffusion towards the free surface can be accomplished by the above-described solid-phase gettering approach, or gaseous-phase gettering approach. In either approach, gettering is effective to create a concentration gradient of the various species of impurities, and continue the driving force for diffusion to the outer surface.

According to one feature, removal of the target portion and subsequent denudation treatment can be carried out prior to use of the processing component in a semiconductor fabrication environment. As such, the foregoing steps may be carried out off-site, separate from the semiconductor fabrication environment, such as by the manufacturer of the processing component rather than the end user (e.g., the semiconductor component manufacturer/wafer processor). The processing component may be fully treated, then packaged in a hermetic shipping container for direct and immediate use in a fabrication environment.

With respect to the particular measurement techniques for characterizing pre- and post-treated CVD-SiC components, particular use is made of Secondary Ion Mass Spectroscopy (SIMS). Other techniques include GDMS, for example. As used herein, the bulk impurity level corresponds to the impurity level at a depth within the outer surface portion at which the purity level first stabilizes, that is, is the depth at which impurity levels become generally constant further into the depth of the outer surface portion. The foregoing bulk impurity level should not be confused with deeper impurity levels that may be associated with a 'dirty' underlying component or substrate; accordingly bulk impurity level is associated with the first occurrence of impurity levels reaching a constant, low point, from the outer surface (0 nm) position. It is noted that impurity detection usually entails some degree of variance, represented by swings in measured impurity levels as a function of depth. Unless otherwise noted herein, while raw data is reported, specific impurity level data points, and particularly the bulk impurity level, are based upon a trend of the impurity contents according to the data, that is, smoothed data. According to characterization studies reported herein, it was found that typically the bulk impurity level is typically reached by a depth of 3 microns. Accordingly, the bulk impurity level may be taken at a depth within a range of about 3 to 10 μm, such as within a range of 3 to 5 μm, for example. Given natural impurity concentration variation as a function of distance, bulk impurity levels, such as those reported hereinbelow, are taken from smoothed data curves as noted above, that is, are taken from the best fit curve representation of raw data, according to standard smoothing. The particular depth value at which the bulk impurity level is reached, however, may be dependent on processing conditions of the particular CVD process utilized to form the outer surface portion, including particular tool used, gases used, temperature, pressure, and other processing parameters.

The data and following discussion focus on characterization studies done on several as-deposited CVD-SiC samples as well as on post-treated CVD-SiC samples.

EXAMPLES

Example 1

Si:SiC coupons of size 25 mm×75 mm×6 mm were prepared using standard processing. The coupons were ultrasonically cleaned in dilute acid, DI water rinsed, and dried. The cleaned coupons were loaded into the CVD reactor and a CVD film between 50-75 microns in thickness was deposited on the surface of the Si:SiC coupons. Multiple coating runs were performed using two different coating systems (Apparatus A and Apparatus B) to further understand equipment effects on coating purity.

The impurity level on the surface of the CVD coated Si:SiC coupons was analyzed by Secondary Ion Mass Spectroscopy (SIMS). The SIMS analysis was conducted with $O_2^+$ plasma using a Cameca 3f instrument in a depth profile mode. The instrument was calibrated using ion implanted SiC standards for accurate impurity determination. The analysis was focused on Fe and Cr alone to enable a good detection limit, viz. 1e15 atoms/cc for Fe and 1e14 atoms/cc for Cr. A few runs were also conducted using a SIMS instrument with a higher sensitivity and a lower Fe detection limit of 1e14 atoms/cc. Unless otherwise noted, the results described hereinafter represent as-deposited or as-removed CVD-SiC, with no intermediate machining operations.

Figure 2:
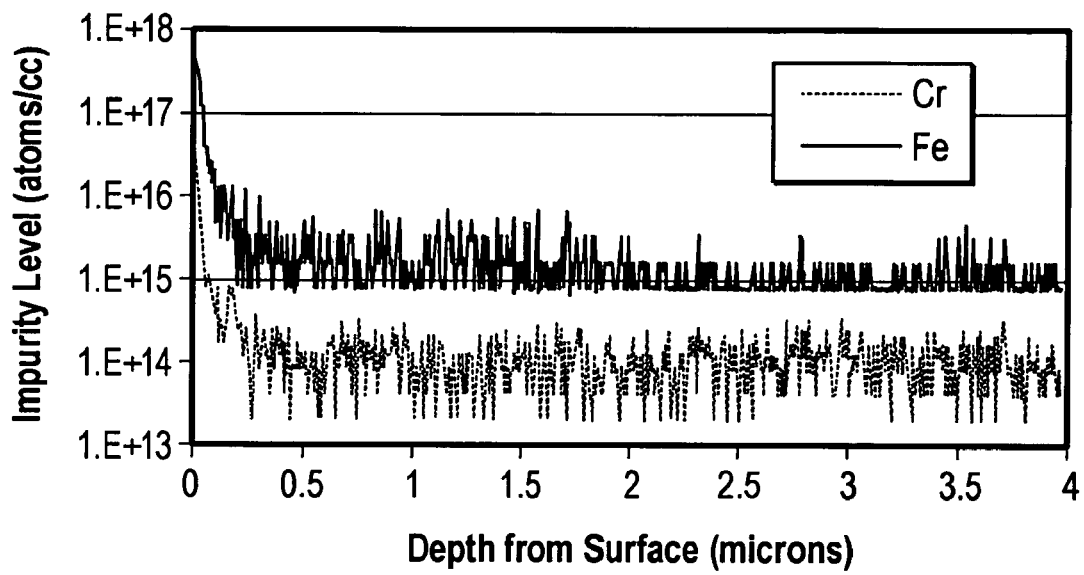
FIGS. 2 and 3 illustrate the impurity depth profile of CVD-SiC films formed in two different commercially available deposition apparatuses.

The SIMS analysis of the CVD-SiC layer of a sample processed by Apparatus A, indicates a high surface contamination of both Fe and Cr that is 500-1000 times higher than the bulk value as shown in FIG. 2. The Fe concentration in the bulk is <1e15 atoms/cc and the Cr concentration is <1e14 atoms/cc, which is typical for CVD-SiC coatings.

Figure 3:
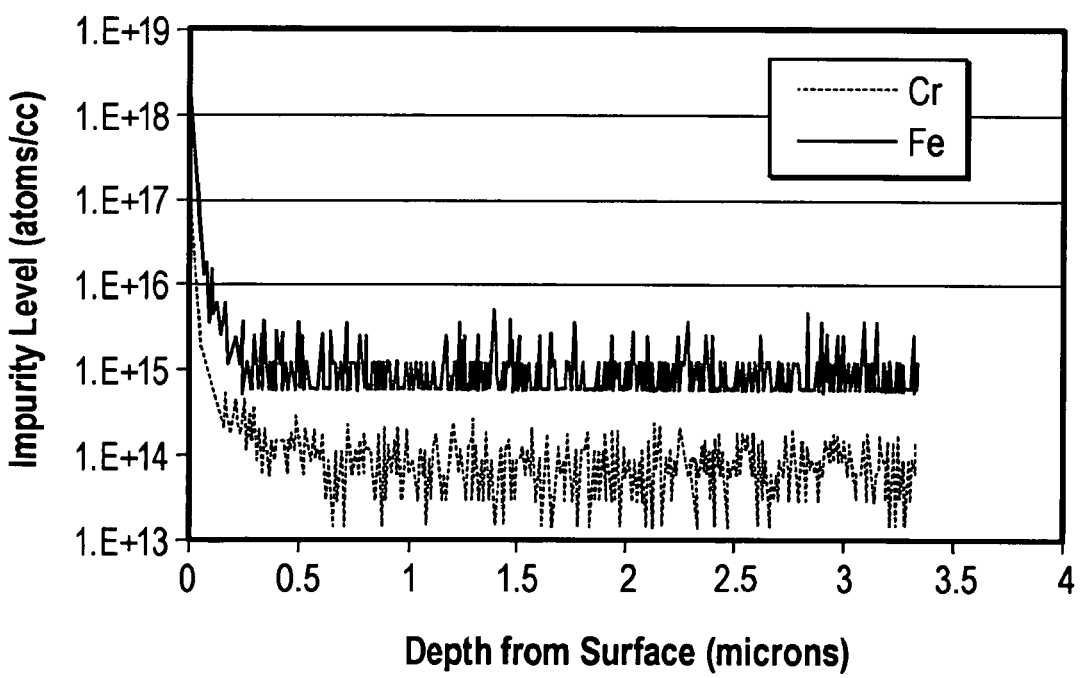

A similar high surface impurity concentration was also observed on the CVD-SiC layer deposited using Apparatus B, as shown in FIG. 3.

Figure 4:
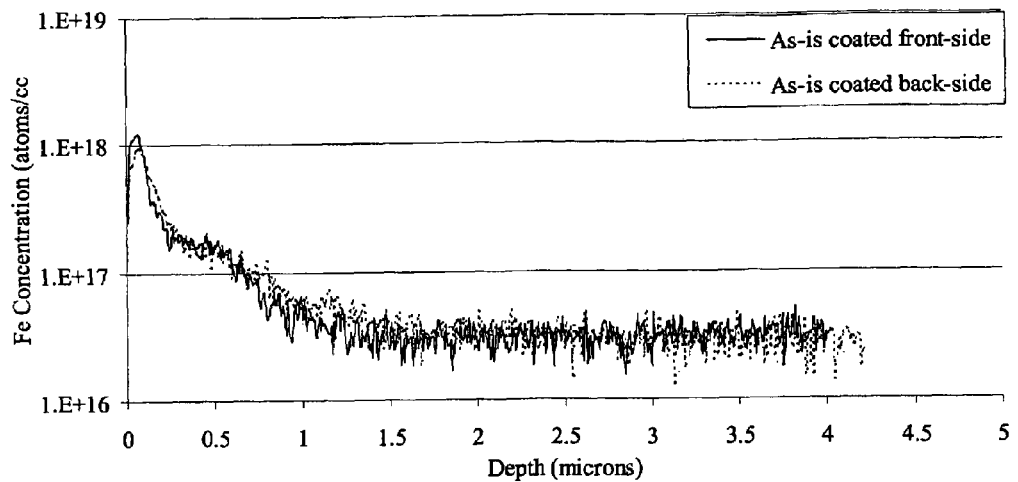
FIG. 4 illustrates the impurity depth profile of CVD-SiC, formed utilizing reactant gases at higher contaminant levels.

The surface Fe concentration is >1e18 atoms/cc and drops to the bulk value of <1e15 atoms/cc within 0.5 microns depth into the CVD-SiC coating for the particular samples under characterization. To verify the universality of high impurity concentration on the surface of as-deposited coatings, a third test was conducted on a CVD-SiC coating with higher impurities in the reactant gases used to form the CVD film. Impurity enrichment was also observed on coatings with higher impurity levels as shown in FIG. 4. The Fe concentration at the surface is >5e17 atoms/cc, and drops over 0.6-0.7 microns to the bulk Fe concentration of 4 e16 atoms/cc.

Mechanisms for impurity enrichment at the surface are not well understood at the present but may relate to impurity migration from the surface of the Si:SiC substrate during the CVD-SiC deposition process or Fe segregation from the interior of the film to the surface during cooling.

Two different types of CVD-SiC coatings were produced with Apparatus A, a standard coating and a lower-purity coating, were selected for cleaning processing. The coupons were loaded onto a CVD coated cantilever paddle and placed into a diffusion furnace equipped with a SiC process tube and cleaned quartz baffles.

The coupons were oxidized at 950-1350° C. for 6-14 hours in flowing O2 with up to 10% HCl gas. The thermal treatment conditions were selected to enable the growth of a thick thermal oxide on the CVD-SiC surface through consumption of a target portion of the CVD-SiC corresponding to about 0.45-0.60, nominally 0.5 times the thickness of the oxide. The oxidation process helps to concentrate the transition metal impurities such as Fe into the oxide layer on the CVD-SiC. While the HCl gas helps to volatilize the impurities on the surface of the growing oxide, HCl treatment is not believed to significantly remove metal trapped within the growing oxide layer. The overall process consumes the contaminated target portion of the CVD-SiC layer through the reaction, $SiC+3/2 O_2$ (g)=$SiO_2$+CO(g) to form $SiO_2$.

Figure 5:
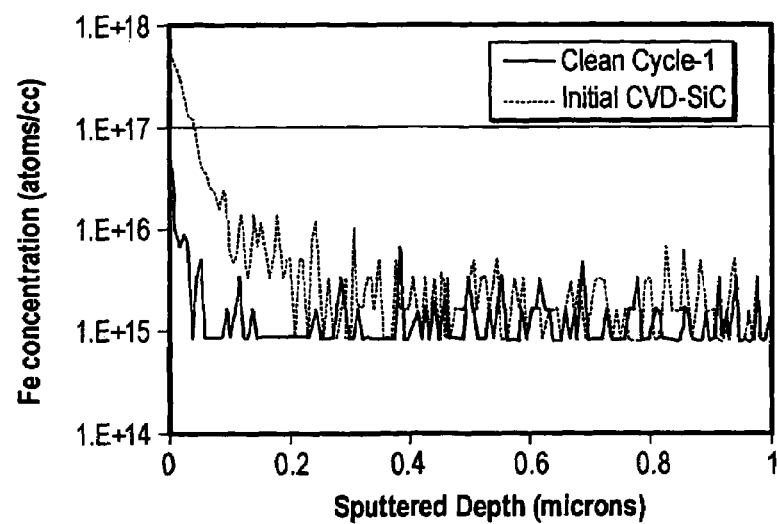
FIG. 5 illustrates the impurity depth profile of a CVD-SiC layer before and after an initial cleaning step.

To remove the bulk impurities within the oxide layer, the oxide layer was stripped in an acid bath using a HF—HCl mixture (1:1 acid mixture). The resulting impurity concentration at the surface is shown in FIG. 5.

SIMS analysis indicates that the surface Fe concentration decreases from >5e17 atoms/cc on the initial CVD-SiC coupon to <5e16 atoms/cc on the cleaned coupon, a 10 fold improvement due to cleaning. The bulk impurity concentration remained constant at <1e15 atoms/cc. While the cleaning cycle decreased surface impurity concentration, the surface impurity concentration was still a factor of 50 higher than the bulk. Thus, an additional cleaning cycle was conducted to further decrease the Fe concentration at the surface. The effect of the $2^{nd}$ cleaning cycle could not be quantified using SIMS due to detection limit issues and noise in the analysis. Accordingly the cleaning cycles were repeated using the CVD-SiC sample with higher impurities (shown in FIG. 4) to help discern minor differences between the surface and bulk impurity levels.

The lower purity CVD-SiC sample was cleaned similar to the standard CVD-SiC sample. The coupons were first oxidized at 950-1350° C. for 6-14 hours in flowing O2 with up to 10% HCl gas to grow an oxide layer that was subsequently stripped by the HF—HCl solution. The cleaning cycle was repeated a second time to remove material deeper into the CVD-SiC surface and thereby remove the Fe-enriched surface layer.

Figure 6:
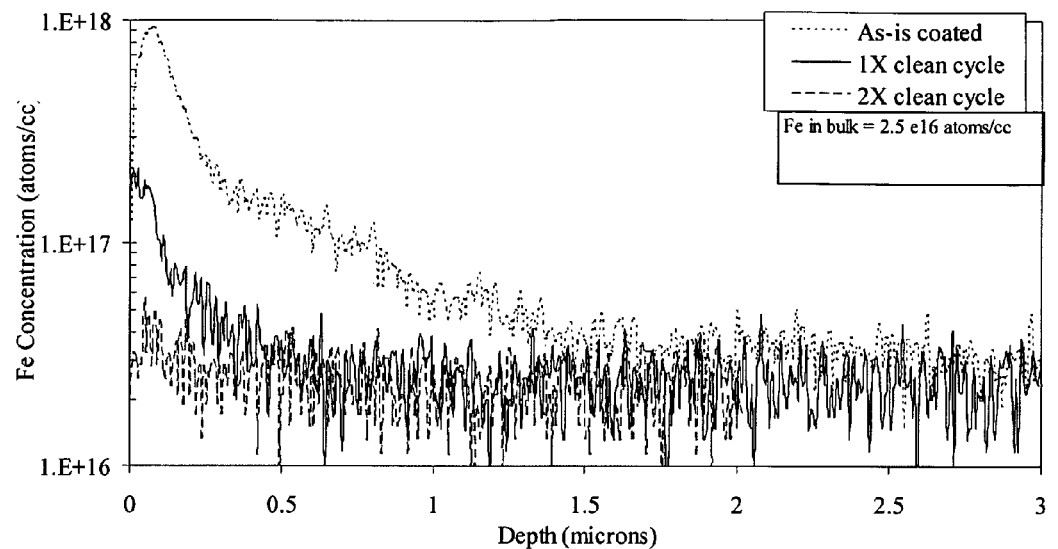
FIG. 6 illustrates a depth profile resulting from two cleaning cycles of another sample, having a relatively low-purity CVD-SiC layer.

SIMS analysis of coupons after two cleaning cycles is shown in FIG. 6. The double cleaning cycle was effective to completely remove the contaminated surface layer, and the surface impurity concentration is similar to the bulk impurity concentration.

Figure 7:
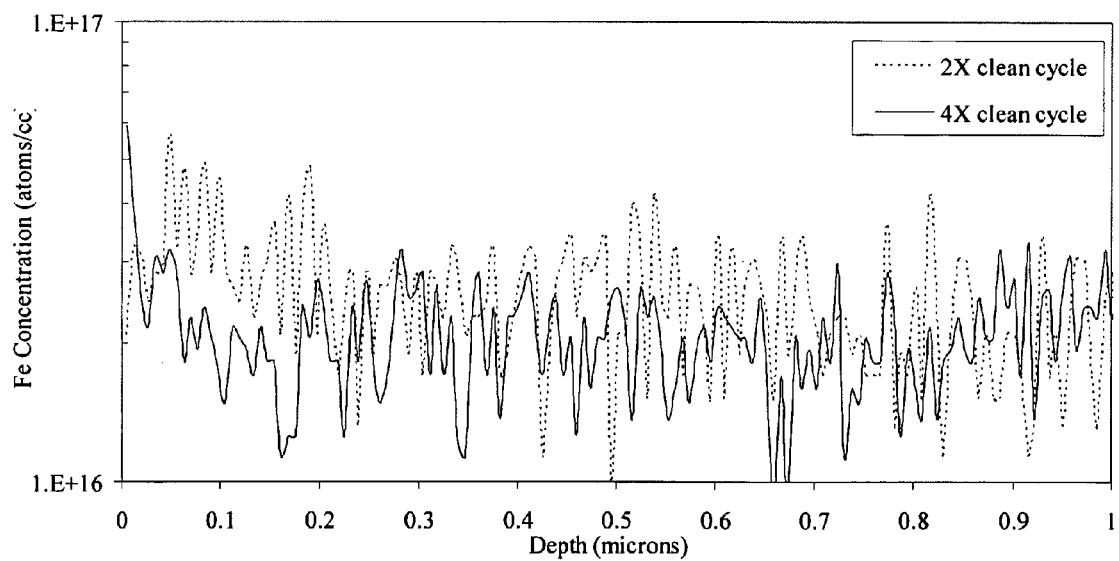
FIG. 7 illustrates depth profiles comparing surface Fe concentration after two cleaning and four cleaning cycles of the sample with a relatively low-purity CVD-SiC layer.

Still further, as demonstrated by FIG. 7, the techniques described herein may be carried out to reduce the impurity level of the surface to be not greater than the bulk impurity level, that is, about equal to or less than the bulk impurity level. For example, an additional 2 cleaning cycles were conducted with no further purity improvements after the initial two cleaning cycles as shown in FIG. 7.

Example 2

Si:SiC coupons of size 6 mm×18 mm×3 mm were machined to provide a smooth surface and then prepared using standard processing. The coupons were ultrasonically cleaned in dilute acid, DI water rinsed, and dried. The cleaned coupons were loaded into the CVD reactor and a CVD film between 25-35 microns in thickness was deposited on the surface of the Si:SiC coupons. The CVD coated samples were re-coated with a CVD film 20-35 microns in thickness to fully seal any thin coating near areas where the coupons are held in the CVD reactor. Coupons with CVD-SiC films of regular Fe concentration of 20 ppb and high Fe concentration of 500-900 ppb were prepared for cleaning trials.

The coupons were loaded onto a CVD coated cantilever paddle and placed into a diffusion furnace equipped with a SiC process tube and cleaned quartz baffles.

Figure 8:
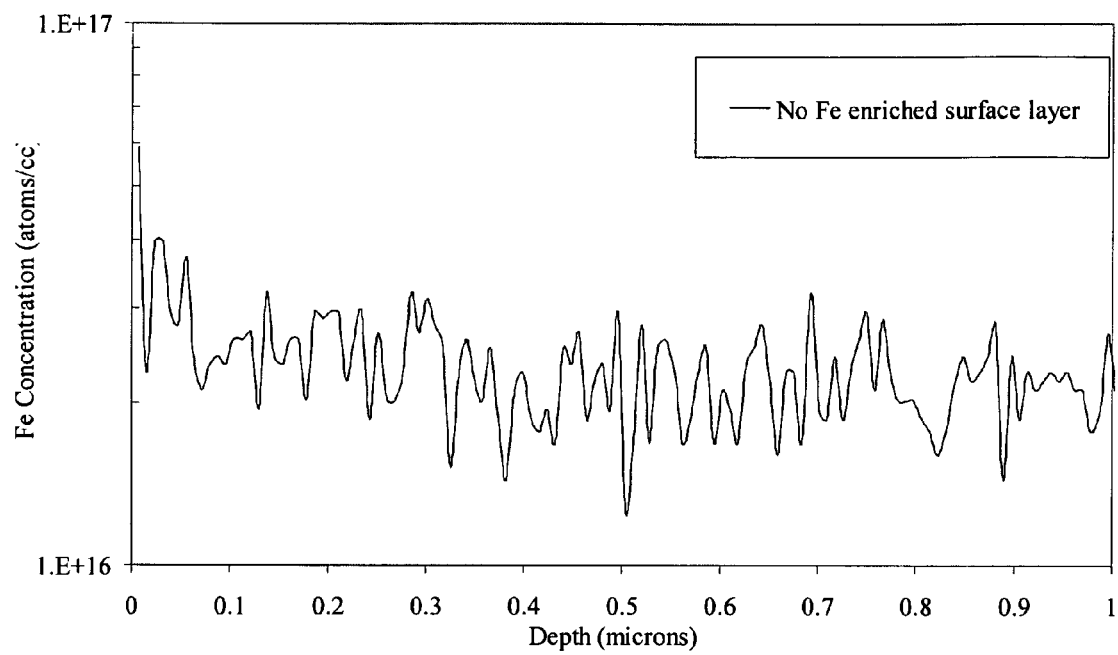
FIG. 8 illustrates depth profile of a relatively low-purity CVD-SiC layer after complete removal of Fe-enriched surface layer.

The coupons were first oxidized at 950-1350° C. for 6-14 hours in flowing $O_2$ with up to 10% HCl gas to grow an oxide layer that was subsequently stripped by the HF—HCl solution. The cleaning cycle was repeated six times to ensure complete removal of the Fe-enriched surface layer and the removal of the Fe-enriched layer was confirmed by SIMS analysis, as shown in FIG. 8.

The cleaned coupons were loaded onto a CVD coated cantilever paddle and placed into a diffusion furnace equipped with a SiC process tube and cleaned quartz baffles.

The coupons were thermally annealed in at 1000-1300 C for 6 to 14 h in Ar flowing at 5-10 SLPM with up to 10 vol % HCl. Denudation relies on the diffusion of metal impurities to the surface where they are subsequently removed by reacting with HCl to form metal halides. The treatment conditions were selected to ensure an adequate chlorine atmosphere for vaporizing transition metal and transition metal silicides into gaseous metal chlorides without decomposing the CVD-SiC film. In addition, long anneal times are required to achieve a minimum denudation depth of 200-250 nm due to the low diffusion coefficient of Fe ($10^{-14}$ cm2/s). A small amount of air was also bled into the atmosphere to further limit HCl attack of CVD-SiC, by formation of a thin passivating layer on the coupon in the form of an oxide layer. While the addition of air is beneficial for SiC stability, excessive air flow can cause too thick of an oxide layer, inhibiting diffusion of impurities and lowering denudation effectiveness. Thus the oxide layer thickness was controlled to be between 500-1500 Å on the CVD-SiC surface.

Figure 9:
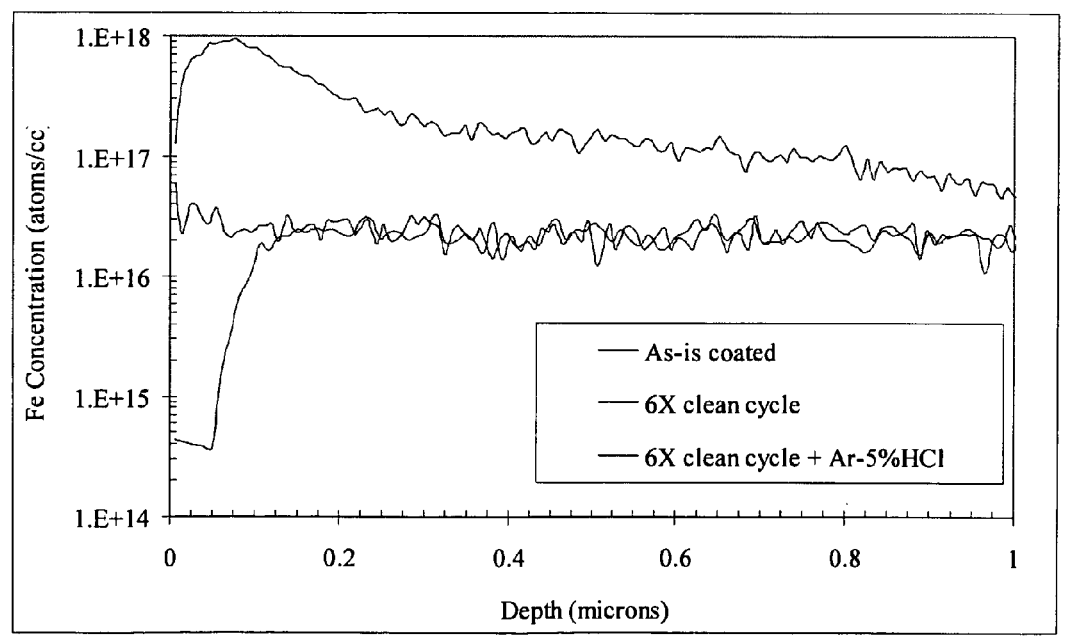
FIG. 9 compares purity levels of a CVD-SiC layer in three states, as-deposited, after being subjected to six cleaning cycles, and after subsequent heat treatment to form a denuded skin portion according to an embodiment.

SIMS analysis of the cleaned sample after the treatment in Ar and HCl gases is shown in FIG. 9. The Fe concentration decreases by a factor ~100× from 3E14 atoms/cc at the surface to 2.2 E16 atoms/cc in the bulk. The low Fe surface region extends from the surface to a depth of up to 215 nm. The low Fe surface is referred as the "denuded zone".

The regular Fe purity sample was also cleaned using a similar process as described for the low Fe purity sample. The Fe concentration in the sample after the initial cleaning steps of oxidation in HCl followed by HF acid cleaning is below the detection limit of the instrument. Thus, the denuded zone at the surface could not be detected by SIMS analysis. However, the regular Fe purity sample can be expected to have a similar "denuded zone" at the surface with a Fe concentration lower than the bulk.

Example 3

Comparative Example

Si:SiC coupons of size 6 mm×18 mm×3 mm were machined to provide a smooth surface and then prepared using standard processing. The coupons were ultrasonically cleaned in dilute acid, DI water rinsed, and dried. The cleaned coupons were loaded into the CVD reactor and a double coated with a CVD film of 25-35 microns in thickness for each coat. Coupons with CVD-SiC films of high Fe concentration of 500-900 ppb were prepared for cleaning trials.

The coupons were loaded onto a CVD coated cantilever paddle and placed into a diffusion furnace equipped with a SiC process tube and cleaned quartz baffles.

The coupons were thermally annealed in at 1000-1300 C for 6 to 14 h in Ar flowing at 5-10 SLPM with up to 10 vol % HCl and cooled in flowing gas of the same atmosphere. A small amount of air was also bled into the atmosphere to further limit HCl attack of CVD-SiC, by formation of a thin passivating layer on the coupon in the form of an oxide layer.

Figure 10:
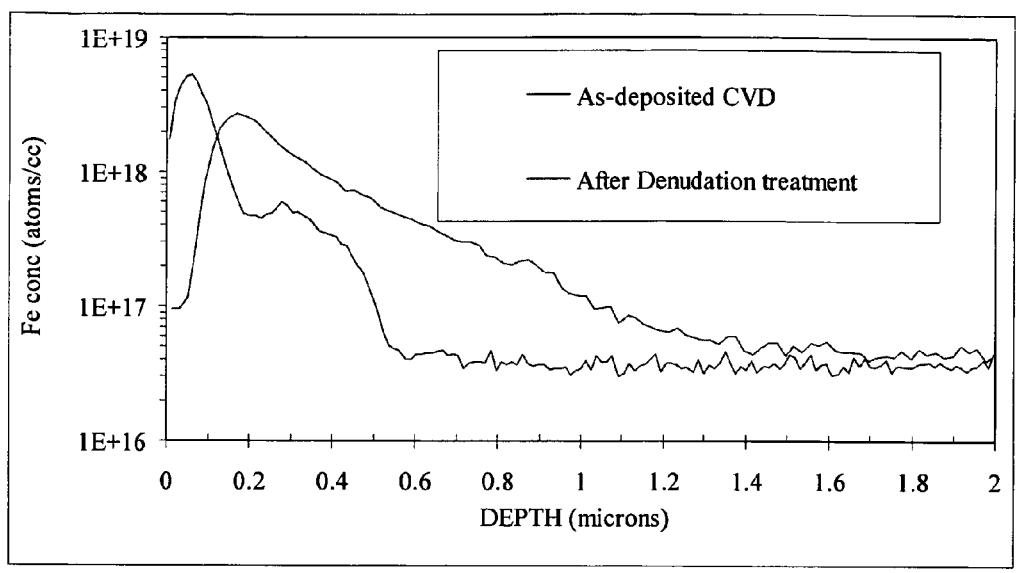
FIG. 10 compares purity levels of a CVD-SiC layer in two states, as-deposited, and after subsequent heat treatment to form a denuded skin portion according to an embodiment.

SIMS analysis of the cleaned sample after the treatment in Ar and HCl gases is shown in FIG. 10. The near surface Fe concentration decreases from 2 E18 atoms/cc in as-deposited CVD to less than 1 E17 atoms/cc in the sample treated in Ar and HCl gases. In addition, the maximum Fe concentration also decreases by a factor of two. Thus, a thin denuded zone is formed for a depth of 200 nm after which the Fe concentration increases. The Fe concentration eventually declines to the bulk impurity level of less than 5 E16 in the bulk of the material. Because of the slow metal diffusion kinetics, the penetration depth within CVD-SiC is <0.4 micron and the direct thermal annealing in Ar and HCl is effective in cleaning the first 200 nm of the CVD-SiC film. Thus, for effective denudation treatments, it is important to remove the Fe-enriched impurity profile prior to denudation treatments.

The regular Fe purity sample was also cleaned using a similar process as described for the low Fe purity sample. The Fe concentration in the sample after the initial cleaning steps of oxidation in HCl followed by HF acid cleaning is below the detection limit of the instrument. Thus, the denuded zone at the surface could not be detected by SIMS analysis. However, the regular Fe purity sample can be expected to have a similar "denuded zone" at the surface with a Fe concentration lower than the bulk.

As should be clear based upon the foregoing, particular embodiments rely upon a process flow that incorporates removal of a target portion that has the capability of reducing the outer surface impurity levels, and particularly, the skin impurity level to be on the order of that of the bulk. Subsequent denudation processing is then effective to create a localized regime of the outer surface of the component that has notably reduced impurity levels. The foregoing denudation approaches typically rely upon a solid-phase gettering mechanism or a gaseous-phase gettering mechanism, approaches effective to create an impurity level concentration gradient to drive impurities to the surface of the component.

Examples above describe denudation zones extending from the outer surface of the component to a depth on the order of 200 nm. Further extended denudation can be accomplished, such as to depths of 300 nm, 400 nm, or 500 nm, for example, by extending high temperature anneal dwell periods. For example, extending annealing to 24 hours is expected to achieve a denudation zone extending to 250 nm or greater. Extended denudation zones can also be accomplished though increased anneal temperatures, such as up to 1300° C., which should achieve a denudation depth of 350 nm or greater. Additionally, extended denudation zones can also be accomplished though increased HCl gas flow. In such cases, the above-described skin impurity level extends beyond 100 nm, and can extend to not less than 200 nm, or in other embodiments, not less than 300 nm and not less than 400 nm.

It is noted that there have been prior attempts at reducing impurity levels of semiconductor-grade components, such as the process described in U.S. Pat. No. 6,277,194. There, a gettering layer is deposited onto a component which may be formed of silicon carbide. However, the process described in U.S. Pat. No. '194 is not effective to create a denudation region that is achieved by embodiments of the present invention. The generalized process flow of U.S. Pat. No. '194 may be sufficient for general reduction in impurity levels, but cannot achieve the notable and quantifiable denuded region according to embodiments herein, which notably have impurity levels of CVD-SiC materials that are lower than bulk impurity levels according to embodiments described above. Likewise, cleaning cycles, even those repeated multiple times, are ineffective to form a denuded zone and do not alone achieve enhanced impurity reduction as described above in accordance with various embodiments.

The above-disclosed subject matter is to be construed as illustrative and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. A method of denuding a semiconductor processing component comprising:
   providing a semiconductor processing component having an outer surface portion formed by chemical vapor deposition of SiC;
   removing a target portion of the outer surface portion, the outer surface portion having a skin impurity level and a bulk impurity level, wherein the skin impurity level is an average impurity level from 0 nm to 100 nm of depth into the outer surface portion, the bulk impurity level is measured at a depth of not less than 3.0 microns into the outer surface portion; and heat treating the component to diffuse impurities from a surface of the outer surface portion, whereby the skin impurity level is not greater than 80% of the bulk impurity level.

2. The method of claim 1, further comprising forming a getter layer overlying the outer surface portion such impurities are driven into the getter layer during heat treating.

3. The method of claim 2, wherein the getter layer has an impurity diffusion coefficient at least 102 times greater than an impurity diffusion coefficient of the outer surface portion.

4. The method of claim 2, wherein the getter layer comprises silicon oxide formed by oxidation of the outer surface portion, or comprises polycrystalline silicon formed by deposition.

5. The method of claim 1, wherein heat treatment is carried out at a temperature not less than 1150° C. for a period of not less than 5 hours.

6. The method of claim 1, wherein heat treatment is carried out in the presence of a halide gas.

7. The method of claim 1, wherein the skin impurity level is not greater than 70% of the bulk impurity level.

8. The method of claim 1, wherein the skin impurity level is not greater than 100 ppb atoms Fe.

* * * * *